United States Patent
Aleksic et al.

(10) Patent No.: US 10,601,615 B2
(45) Date of Patent: Mar. 24, 2020

(54) SERIAL LINK RECEIVER WITH IMPROVED BANDWIDTH AND ACCURATE EYE MONITOR

(71) Applicant: Rambus Inc., Sunnyvale, CA (US)

(72) Inventors: Marko Aleksic, Mountain View, CA (US); Pravin Kumar Venkatesan, Fremont, CA (US); Simon Li, Cupertino, CA (US); Nikhil Vaidya, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/161,547

(22) Filed: Oct. 16, 2018

(65) Prior Publication Data

US 2019/0149366 A1     May 16, 2019

Related U.S. Application Data

(63) Continuation of application No. 15/438,571, filed on Feb. 21, 2017, now Pat. No. 10,135,642.

(Continued)

(51) Int. Cl.
*H04L 25/03*     (2006.01)
*H03M 13/21*     (2006.01)

(Continued)

(52) U.S. Cl.
CPC ...... *H04L 25/03057* (2013.01); *H03M 13/21* (2013.01); *H03M 13/6502* (2013.01); *H04L 1/0047* (2013.01); *H04L 1/0057* (2013.01)

(58) Field of Classification Search
CPC .............................................. H04L 25/03057

(Continued)

(56) References Cited

U.S. PATENT DOCUMENTS 5,847,602 A * 12/1998 Su ..................... H03F 1/0222
                                                  330/10
5,914,933 A * 6/1999 Cimini ................ H04B 7/0613
                                              370/208

(Continued)

FOREIGN PATENT DOCUMENTS

WO    WO-2008-063431 A2    5/2008

OTHER PUBLICATIONS

Chung et al., "A 7.5-GS/s 3.8-ENOB 52-mW flash ADC with Clock Duty Cycle Control in 65nm CMOS," 2009 Symposium on VLSI Circuits Digest of Technical Papers, pp. 268-269. 2 pages.

(Continued)

*Primary Examiner* — Lihong Yu
(74) *Attorney, Agent, or Firm* — Fenwick & West LLP

(57) ABSTRACT

A receiver includes a decision circuit, a circuit to adjust an input signal of the decision circuit, a correction circuit and a control circuit. The decision circuit makes a data decision based on an input signal of the decision circuit. The circuit to adjust the input signal of the decision circuit adjusts the input signal of the decision circuit based on an input correction signal. The correction circuit combines a plurality of signals corresponding to different input correction parameters into a preliminary input correction signal. An input of the correction circuit is coupled to an output of the decision circuit. The control circuit maps the preliminary input correction signal into the input correction signal using a nonlinear code mapping.

20 Claims, 7 Drawing Sheets

Related U.S. Application Data

(60) Provisional application No. 62/301,549, filed on Feb. 29, 2016.

(51) Int. Cl.
*H03M 13/00* (2006.01)
*H04L 1/00* (2006.01)

(58) Field of Classification Search
USPC .......................................................... 375/233
See application file for complete search history.

(56) References Cited

U.S. PATENT DOCUMENTS

| | | | |
|---|---|---|---|
| 6,016,140 A | 1/2000 | Blouin et al. | |
| 6,229,466 B1 | 5/2001 | Gattani | |
| 6,614,434 B1 | 9/2003 | Finke | |
| 6,980,140 B1 | 12/2005 | Rowland et al. | |
| 7,323,922 B1 | 1/2008 | Jones | |
| 7,368,946 B1 | 5/2008 | Rahman et al. | |
| 7,567,616 B2 | 7/2009 | Lin | |
| 9,491,009 B1 | 11/2016 | Vareljian et al. | |
| 2004/0203559 A1 | 10/2004 | Stojanovic et al. | |
| 2004/0228337 A1 | 11/2004 | Naoi et al. | |
| 2007/0110199 A1 | 5/2007 | Momtaz et al. | |
| 2008/0049825 A1 | 2/2008 | Chen et al. | |
| 2008/0101510 A1 | 5/2008 | Agazzi | |
| 2008/0191910 A1 | 8/2008 | Simpson | |
| 2008/0219390 A1 | 9/2008 | Simpson et al. | |
| 2009/0279597 A1 | 11/2009 | Bereza et al. | |
| 2009/0304066 A1 | 12/2009 | Chmelar et al. | |
| 2010/0195776 A1 | 8/2010 | Chmelar et al. | |
| 2012/0314756 A1 | 12/2012 | Leibowitz et al. | |

OTHER PUBLICATIONS

Chung et al., "Design-Space Exploration of Backplane Receivers with High-Speed ADCs and Digital Equalization," IEEE 2009 Custom Integrated Circuits Conference, Sep. 2009, pp. 555-558. 4 pages.

Graf, Rudolf F., "Modern Dictionary of Electronics," Seventh Edition, 1999, p. 180. 6 pages.

Harwood, M. et al., "12.5Gb/s SerDes in 65nm CMOS Using a Baud-Rate ADC with Digital Receiver Equalization and Clock Recovery", ISSCC 2007/Session24/Multi-GB/s Transceivers/24.1. 10 Pages.

Harwood, M. et al., "A 12.5GB/s SerDes in 65nm CMOS Using a Baud Rate ADC with Digital RX Equalization and Clock Recovery", 2007 IEEE International Solid-State Conference. 18 Pages.

International Preliminary Report on Patentability (Chapter I) dated Sep. 7, 2012 in International Application No. PCT/US2010/058088. 6 pages.

International Search Report and the Written Opinion dated Mar. 31, 2011 re Int'l Application No. PCT/US2010/058088. 9 Pages.

MAXIM Integrated Products, "Understanding Flash ADCs", Application Note 810 dated Oct. 2, 2001. 8 Pages.

Shahramian et al., "A 35-GS/s, 4-Bit Flash ADC With Active Data and Clock Distribution Trees," IEEE Journal of Solid-State Circuits, vol. 44, No. 6, Jun. 2009, pp. 1709-1720. 12 pages.

Varzaghani et al., "A 4.8 GS/s 5-bit ADC-Based Receiver With Embedded DFE for Signal Equalization," IEEE Journal of Solid-State Circuits, vol. 44, No. 3, Mar. 2009, pp. 901-915. 15 pages.

\* cited by examiner

SERIAL LINK RECEIVER WITH IMPROVED BANDWIDTH AND ACCURATE EYE MONITOR

CROSS-REFERENCE TO RELATED APPLICATION

This application is a continuation of U.S. patent application Ser. No. 15/438,571 filed on Feb. 21, 2017 which claims priority from U.S. Provisional Patent Application No. 62/301,549 filed on Feb. 29, 2016, each of which is incorporated by reference in its entirety.

BACKGROUND

It is desirable for data communication systems to increase data bandwidth so that more data can be transmitted from a transmitter to a receiver in a short amount of time. However, as data bandwidth requirements increase, it becomes increasingly more challenging for the receiver to recover data from the incoming data stream without errors.

BRIEF DESCRIPTION OF THE DRAWINGS

The disclosed embodiments have advantages and features that will be more readily apparent from the detailed description, the appended claims, and the accompanying figures (or drawings). A brief introduction of the figures is below.

Figure (FIG. 1 is a high speed communication system that includes a receiver, according to a one embodiment.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

In one embodiment, a receiver includes a decision circuit, a circuit to adjust an input signal of the decision circuit, a correction circuit and a control circuit. The decision circuit makes a data decision based on an input signal of the decision circuit. The circuit to adjust the input signal of the decision circuit adjusts the input signal of the decision circuit based on an input correction signal. The correction circuit combines a plurality of signals corresponding to different input correction parameters into a preliminary input correction signal. An output of the decision circuit is coupled to an input of the correction circuit. The control circuit maps the preliminary input correction signal into the actual input correction signal using a nonlinear code mapping.

In another embodiment, the receiver includes a summing circuit, a decision circuit, circuitry to drive a set of test voltages, circuitry to determine a plurality of preamp codes, and circuitry to generate a nonlinear preamp code mapping. The summing circuit includes a preamp having nonlinear characteristics. The decision circuit has an input coupled to an output of the summing circuit. The circuitry to drive the set of test voltages drives the set of test voltages at the input of the summing circuit. The circuitry to determine the plurality of preamp codes determines the plurality of preamp codes corresponding to the test voltages based on an output of the decision circuit. The circuitry to generate the nonlinear preamp code mapping generates the nonlinear preamp code mapping based on the plurality of preamp codes. The nonlinear preamp code mapping corrects for the nonlinear characteristics of the preamp to make the preamp response linear.

Figure 1:
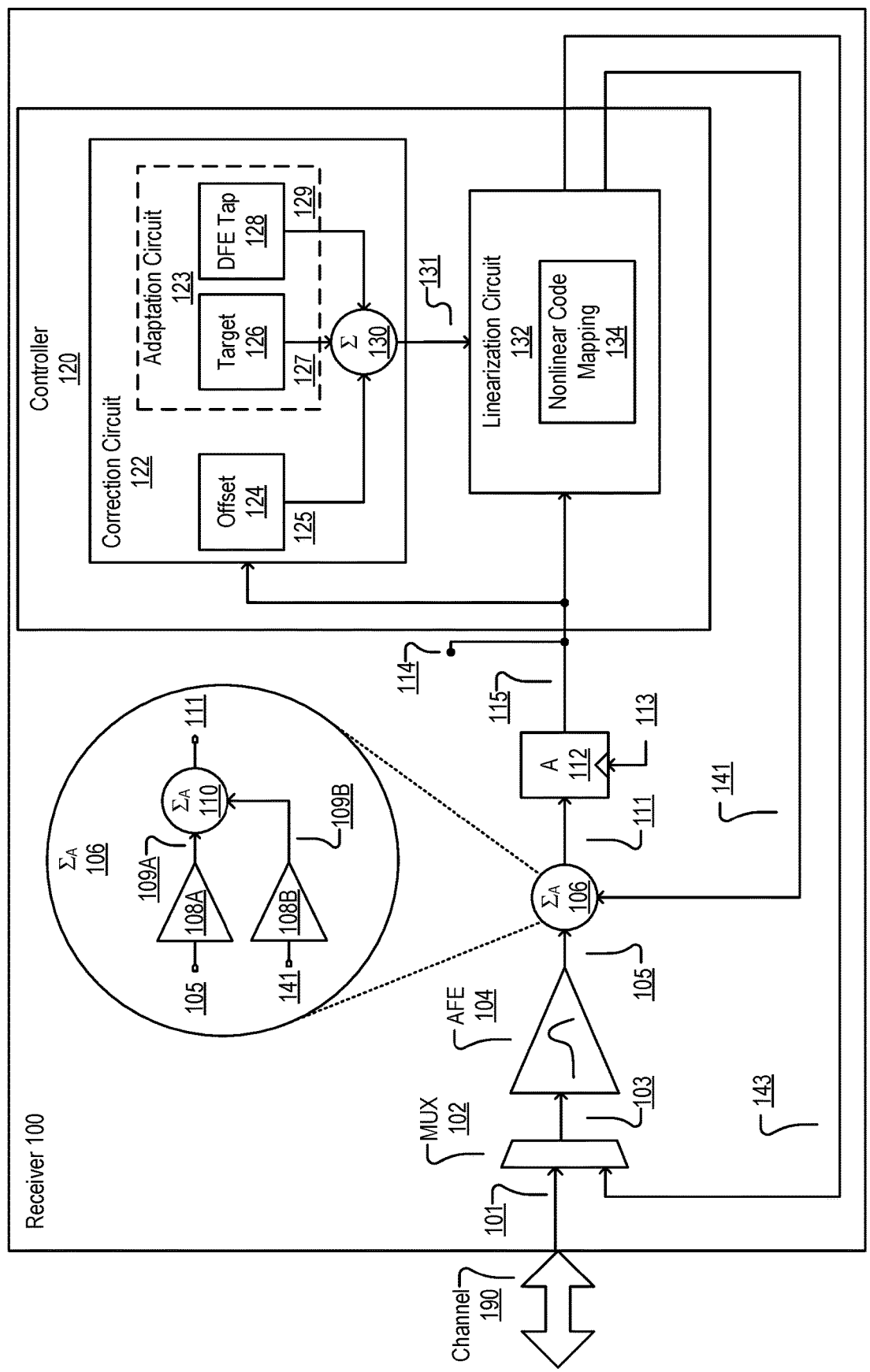

FIG. 1 is a high speed communication system that includes a receiver 100, according to one embodiment. The receiver 100 is coupled to a wired or wireless communication channel 190 and receives an analog channel signal 101 from a remote transmitter (not shown) through the wired or wireless communication channel 190. The analog channel signal 101 carries single ended or differential signals.

The analog channel signal 101 is generated at the transmitter from digital data. The receiver 100 recovers an output data signal 115 at an output node 114 from the analog channel signal 101. The output node 114 can be coupled to components of the receiver 100 not illustrated in FIG. 1. In some embodiments, the receiver 100 can be a standalone device or part of a larger device, such as an application specific integrated circuit (ASIC). The receiver 100 includes a multiplexer (MUX) 102, an analog front end (AFE) 104, a summing preamp circuit ($\Sigma_A$) 106, a data decision circuit (A) 112, and a controller 120. Each of these components can be implemented with hardware circuits that generate signals, and the lines connecting the components carry signals from one component to the next.

The receiver 100 can operate in two modes: a calibration mode and a normal operating mode. In the calibration mode, the controller 120 generates a nonlinear preamp code mapping that corrects for nonlinear characteristics of the summing preamp circuit 106. In the normal operating mode, the controller 120 adjusts a preamp code provided to the summing preamp circuit 106 based on the generated nonlinear preamp code mapping.

The MUX 102 receives the analog channel signal 101 and a test voltage signal 143 and selects one of the analog channel signal 101 and the test voltage signal 143 for its output, selected signal 103. In the calibration mode, the MUX 102 selects the test voltage signal 143, and in the normal operating mode, the MUX 102 selects the analog channel signal 101.

The input of the AFE 104 is coupled to the output of the MUX 102. The AFE 104 performs pre-processing of the selected signal 103 to generate an analog input signal 105. The analog channel signal 101 can be non-ideal due to channel impairments, such as insertion loss, crosstalk, inter symbol interference and optical dispersion. The AFE 104 uses analog processing to reduce some of these non-idealities. Examples of analog processing techniques include gain adjustment or continuous time equalization filters. In other embodiments, the AFE 104 can simply be an input terminal that receives the selected signal 103 and passes it on to generate the analog input signal 105 with no signal processing.

The summing preamp circuit 106 receives the analog input signal 105 from the AFE 104 and an input correction signal 141 from the controller 120, buffers the analog input signal 105, converts the input correction signal 141 into an analog signal and then combines the buffered analog input signal and the converted input correction signal to generate a corrected input signal 111. The input correction signal 141 is a digital signal that includes multi-bit digital codes and provides feedback for adjusting a voltage level of the corrected input signal 111.

Unlike in the summing preamp circuit 106 illustrated in FIG. 1 that receives a single correction signal 141, the summing preamp circuit 106 traditionally receives an analog offset correction signal, an analog target signal, and an analog decision feedback equalizer (DFE) tap signal. The summing preamp circuit 106 traditionally includes a main preamp to buffer the analog input signal 105, and can also include a second preamp to convert an offset correction signal to the analog offset correction signal, a third preamp to convert a target voltage signal to the analog target voltage signal, and a fourth preamp to convert a DFE tap signal to the analog DFE tap signal. The summing preamp circuit 106 traditionally including separate second through fourth preamps ensures that responses of the second through fourth preamps (i.e., the analog signals output from the second through fourth preamps) are linear. However, including the second through fourth preamps causes bandwidth limitations when the analog signals output from the second through fourth preamps are combined with the buffered analog signal output from the main preamp. The bandwidth limitations can be, for example, due to parasitic loading from the second through fourth preamps.

To overcome the bandwidth limitations, the previously described second through fourth preamps in the summing preamp circuit 106 are combined into a single correction preamp. The single correction preamp is used to convert an input correction signal representing a combination of the offset correction signal, the target voltage signal and the DFE tap signal into a corrected analog signal. Although replacing multiple preamps (i.e., the second through fourth preamps) with a single correction preamp does create nonlinearity which is compensated for by use of a nonlinear code mapping as described below.

As shown in FIG. 1, the summing preamp circuit 106 according to an embodiment of the present disclosure includes a main preamp 108A, a correction preamp 108B and a summing node ($\Sigma_A$) 110. The main preamp 108A has linear characteristics whereas the correction preamp 108B has nonlinear characteristics. If left uncorrected, the nonlinear characteristics of the correction preamp 108B can lead to an undesired amount of correction to the corrected input signal 111. In addition, if shmooing of the corrected input signal 111 is performed using the data decision circuit 112 (or another detection circuit whose input is coupled to the corrected input signal 111) in conjunction with the summing preamp circuit 106, the nonlinear response of the correction preamp 108B can lead to inaccurate eye monitor measurements, specifically, an inaccurate estimate of a vertical eye opening. The main preamp 108A receives the analog input signal 105 and buffers the analog input signal 105 into a buffered signal 109A. Correction preamp 108B is implemented as a digital to analog converter (DAC). The correction preamp 108B receives the input correction signal 141 and converts the input correction signal 141 into an analog correction signal 109B. The analog correction signal 109B is an analog representation of the digital input correction signal 141. The summing node 110 receives the buffered signal 109A and the analog correction signal 109B and combines the two inputs to generate the corrected input signal 111.

Additionally, signals 101, 103, 105 and 111 are typically differential signals, although they are shown only with single lines in FIG. 1. In other embodiments these and other signals within the receiver 100 may be either differential or single ended, depending on the embodiment.

Figure 2:
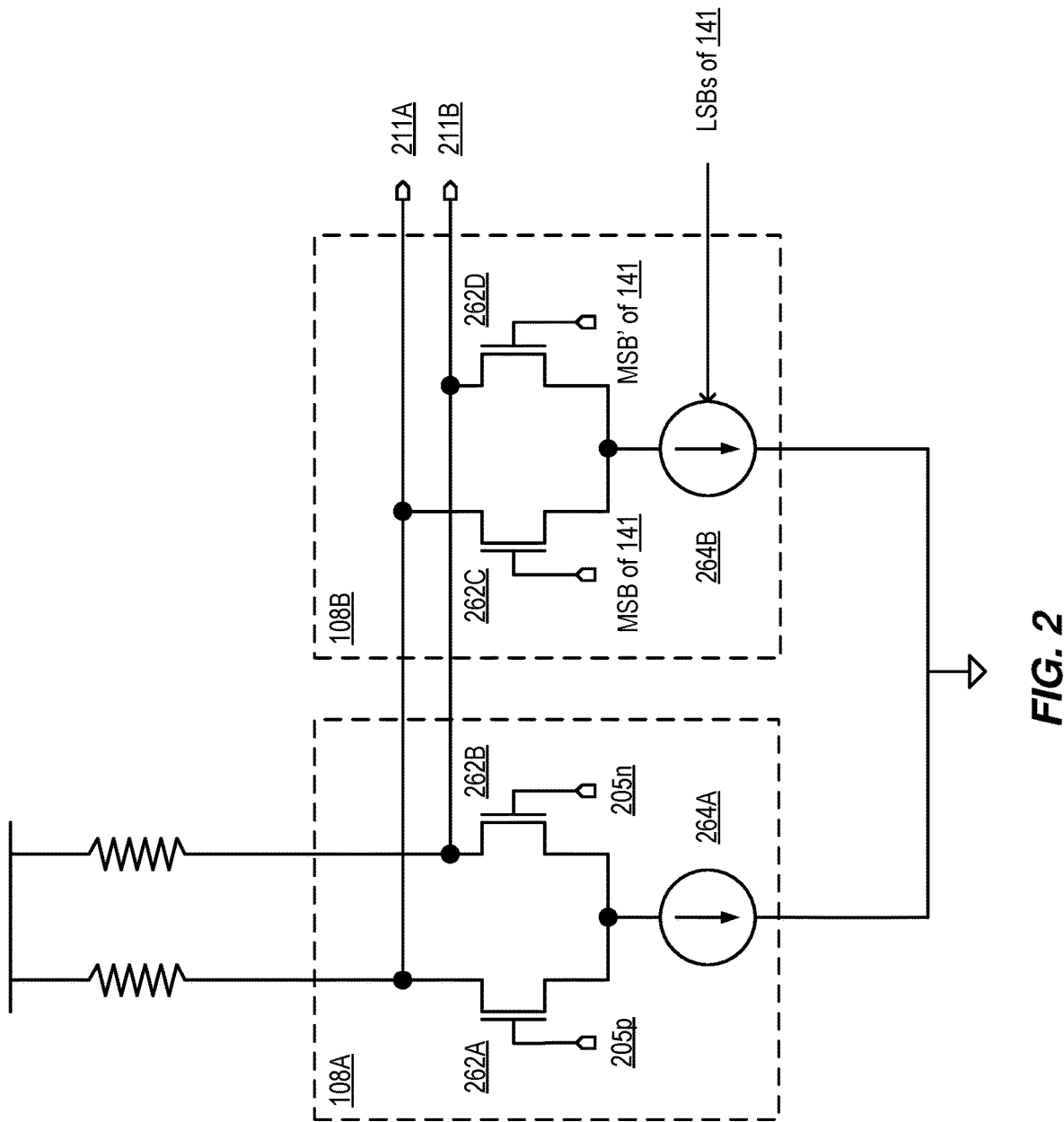
FIG. 2 is an example implementation of a summing circuit, according to one embodiment.

Referring briefly to FIG. 2, it illustrates an implementation of the summing preamp circuit 106, according to one embodiment. The main preamp 108A includes first and second transistors 262A-B and current source 264A. The first transistor 262A is controlled by a positive differential analog input signal 205*p* and the second transistor 262B is controlled by a negative differential analog input signal 205*n*. In one embodiment, the positive and negative differential analog signals 205*p* and 205*n* are positive and negative differential signals of the analog input signal 105. In one embodiment, the current source 264A is not controlled by any of the signals of FIG. 1. In this embodiment, the current source 264A can be a fixed current source. The main preamp 108A has substantially linear gain.

Similarly, the correction preamp 108B includes third and fourth transistors 262C-D and digitally controlled current source 264B. The multi-bit digital codes of the input correction signal 141 include a most significant bit (MSB) and one or more least significant bits (LSBs). The LSBs of the multi-bit digital codes of the input correction signal 141 control the level of current sunk by the current source 264B. The current sunk by the current source 264B can be referred to as tail current.

The MSB of the multi-bit digital codes of the input correction signal 141 controls which transistor 262C and 262D is turned on and is provided with the current. The third transistor 262C is controlled by the MSB of the multi-bit digital code of the input correction signal 141 and the fourth transistor 262D is controlled by an inverted value of the MSB (MSB') of the multi-bit digital code of the input correction signal 141.

The structure of the correction preamp 108B causes the correction preamp 108B to have nonlinear digital to analog conversion characteristics. In other words, the relationship between input correction signal 141 and the analog correction signal 109B is not a linear relationship. Instead, this relationship is nonlinear.

Referring back to FIG. 1, the data decision circuit 112 receives the corrected input signal 111 and makes a data decision on the logical data value represented by the voltage of corrected input signal 111. The data decision circuit 112 then generates the output data signal 115 that represents the data decision. The output data signal 115 can be a binary signal.

The data decision circuit 112 is controlled by its own sampling clock signal 113. The data decision circuit 112 generates the output data signal 115 at the phase of the sampling clock signal 113. In one embodiment, the data decision circuit 112 includes a comparator that compares the positive and negative differential portions of the corrected input signal 111 to each other, and generates the output data signal 115 from this comparison.

In one embodiment, the signal path from MUX 102 to the corrected input signal 111 represents a primary signaling path through the receiver 100. The signal path from controller 120 through input correction signal 141 and preamp 108B represents a feedback correction path through the receiver 100.

The controller 120 receives the output data signal 115 and generates the test voltage signal 143 and the input correction signal 141. In the calibration mode, the controller 120 generates a nonlinear preamp code mapping 134 that accounts for the nonlinear characteristics of the correction preamp 108B. In the normal operating mode, the controller 120 generates mapped preamp codes using the nonlinear preamp code mapping 134. The controller 120 includes a correction circuit 122 and a linearization circuit 132.

In the calibration mode, the linearization circuit 132 receives the output data signal 115 and generates the nonlinear preamp code mapping 134 that accounts for the nonlinear characteristics of the correction preamp 108B. The code mapping 134 can be stored in a look up table (LUT) or in the form of an equation. The operation of the linearization circuit 132 is now explained in greater detail by reference to FIG. 3A-3B.

Figure 3A:
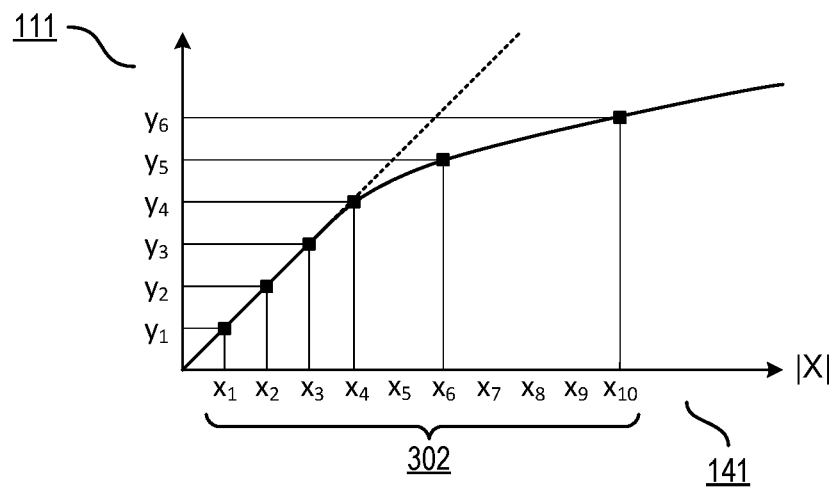
FIG. 3A illustrates a relationship between preamp codes and a corrected input signal, according to one embodiment.

Referring briefly to FIG. 3A, it illustrates a magnitude of a voltage of the corrected input signal 111 as a function of a magnitude of the input correction signal 141. The relationship between the input correction signal 141 and the analog correction signal 109B observed at the corrected input signal 111 is not a linear relationship. That is, as the values of the input correction signal 141 increases in fixed increments, the voltage of the corrected input signal 111 increases in a nonlinear manner.

Specifically, the X-axis represents absolute values of a full set of preamp codes 302 that can be output via the input correction signal 141. The Y-axis represents absolute values of voltages of the corrected input signal 111. To correct for the nonlinear relationship between preamp codes 302 and voltages of the corrected input signal 111, the linearization circuit 132 attempts to identify a subset of the full set of preamp codes 302 that result in a linear relationship to the voltages of the corrected input signal 111.

The initial full set 302 represents all possible preamp codes the linearization circuit 132 can output as values of the input correction signal 141. As illustrated in FIG. 3A, the initial full set 302 includes preamp codes $x_1$ through $x_{10}$. The linearization circuit 132 determines a preamp code (e.g., $x_1$) of the initial full set 302 which cancels out a voltage (e.g., $y_1$) and causes the output data signal 115 to change values. The linearization circuit 132 repeats this process for 'n' test voltages at the test voltage signals 143, which result in 'n' corrected voltages at the corrected input signal 111, and determines 'n' preamp codes of the initial full set 302. Each of the determined 'n' preamp codes of the initial full set 302 corresponds to a test voltage at the test voltage signal 143 based on a corrected voltage at the corrected input signal 111.

Specifically, the linearization circuit 132 outputs a test voltage at the test voltage signal 143 which results in a corrected voltage (e.g., $y_1$) at the corrected input signal 111. The linearization circuit 132 varies the value of the input correction signal 141 by varying (i.e., sweeping) preamp codes of an initial full set of preamp codes 302 while monitoring the output data signal 115. The linearization circuit 132 varies the value of the input correction signal 141 until the corrected input signal 111 reaches zero volts. Once the corrected input signal 111 reaches zero volts, the output data signal 115 changes values (e.g., from 1 to 0). The preamp code 302 that caused the output data signal 115 to change values is added to the subset.

Successive test voltages at the test voltage signal 143 result in successive corrected voltages (i.e., $y_1$ through $y_6$) at the corrected input signal 111. The successive corrected voltages at the corrected input signal 111 are equidistant. Similarly, successive preamp codes of the initial full set of preamp codes 302 are also equidistant. However, not every preamp code of the initial full set 302 corresponds to a test voltage of the test voltage signal 143 based on a corrected voltage at the corrected input signal 111. For example, preamp code $x_5$ and preamp codes $x_7$ through $x_9$ of the initial full set 302 do not correspond to a corrected voltage at the corrected input signal 111. Thus, there is a nonlinear relationship between the initial full set of preamp codes 302 and the corrected voltages of the corrected input signal 111.

Figure 3B:
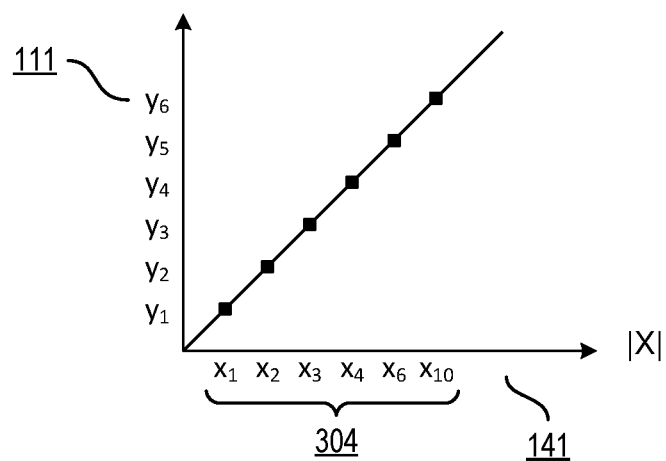
FIG. 3B illustrates a relationship between mapped preamp codes and a corrected input signal, according to one embodiment.

To correct the nonlinear relationship, the linearization circuit 132 generates a nonlinear preamp code mapping 134 based on a subset of preamp codes of the initial full set of preamp codes 302 that correspond to corrected voltages at the corrected input signal 111. As illustrated in FIG. 3B, the subset of preamp codes 304 includes $x_1$ through $x_4$, $x_6$, and $x_{10}$. The reduced set 304 is determined from the initial full set 302. The reduced set 304 does not include preamp codes of the initial full set 302 that do not correspond to a corrected voltage at the corrected input signal 111. For example, preamp code $x_5$ and preamp codes $x_7$ through $x_9$ of the initial full set 302 are not included in the reduced set 304. Providing only the reduced set of preamp codes 304 to the preamp 108B results in a linear relationship with the corrected input signal 111.

In one embodiment, the nonlinear code mapping 134 can be generated as a look up table that maps input codes to output codes. The table can be similar to this table:

| Input code | Mapped Code |
|---|---|
| $x_1$ | $x_1$ |
| $x_2$ | $x_2$ |
| $x_3$ | $x_3$ |
| $x_4$ | $x_4$ |
| $x_5$ | $x_6$ |
| $x_6$ | $x_{10}$ |

In other embodiments, the nonlinear preamp code mapping 134 can be generated in the form of a formula. In other embodiments, the nonlinear preamp code mapping 134 may be generated in other forms.

In the normal operating mode, the linearization circuit 132 receives a combined correction signal 131 from the correction circuit 122, maps the combined correction signal 131 into a mapped preamp code of the reduced set 304 using the nonlinear preamp code mapping 134, and generates the input correction signal 141 with the mapped preamp code. In one example, the combined correction signal 131 represents a desired amount of voltage correction at the corrected input signal 111. In this example, the linearization circuit 132 maps the combined correction signal 131 to a preamp code of the reduced set of preamp codes 304 using the nonlinear preamp code mapping 134.

Referring back to FIG. 1, the correction circuit 122 receives the output data signal 115 and generates the combined correction signal 131. The correction circuit 122 includes an offset correction circuit 124, an adaption circuit 123, and a parameter summing circuit 130. The adaptation circuit 123 includes an adaptation target circuit 126 and a DFE tap circuit 128.

In the normal operating mode, the offset correction circuit 124 generates an offset correction signal 125, the adaption circuit 123 generates a target voltage signal 127 and a DFE tap signal 129. Specifically, the adaptation target circuit 126 generates the target voltage signal 127 and the DFE tap circuit 128 generates the DFE tap signal 129. Each of signals 125, 127 and 129 represent a different correction parameter that is used to correct for a different signaling problem. The parameter summing circuit 130 combines the offset correction signal 125, the target voltage signal 127, and the DFE tap signal 129 to generate the combined correction signal 131. In one example, the combined correction signal 131 represents a target amount of correction to apply to the corrected input signal 111.

As mentioned previously, combining the offset correction signal 125, the target voltage signal 127, and the DFE tap signal 129 leads to bandwidth improvements in the receiver 100. This is because, instead of having separate preamps in the summing preamp circuit 106 for each correction parameter signal, only a single preamp 108B can be used to apply all three correction parameters to the corrected input signal 111. As a result, the capacitive load at the input to the decision circuit 112 can be decreased. Although replacing multiple preamps with a single preamp 108B does create non-linearity in the preamp 108B, the non-linearity is compensated for by use of the nonlinear code mapping 134.

The offset correction circuit 124 generates the offset correction signal 125 representing a target amount of voltage compensation needed to compensate for a direct current (DC) offset between the positive and negative differential inputs of the data decision circuit 112 (i.e., the corrected input signal 111). The DC offset of the data decision circuit 112 is an inherent and unwanted characteristic of the data decision circuit 112. The offset correction circuit 124 can use the output data signal 115 and certain offset cancellation algorithms to determine an amount of offset correction needed to cancel out this unwanted offset.

The adaptation circuit 123 tries to find a set of TX and RX (CTLE+VGA+DFE) coefficients to minimize channel intersymbol interference (ISI) and hence improve signal quality. A typical algorithm that is used is the sign-sign LMS (or, SS-LMS). It is an iterative process. In each step, an adaptation algorithm changes the coefficients (e.g., CTLE, VGA, DFE tap values) and observes whether the received signal is below or above some target voltage level, in order to evaluate whether the new coefficient helps or hurts the signal. Conceptually, this is done by comparing the corrected input signal 111 to the target voltage level. In practice, this comparison is done indirectly by applying the target voltage to the input of the data decision circuit 112 via input correction signal 141, which effectively adjusts the trip threshold of the data decision circuit 112 by introducing an additional voltage at the correction input signal 111 input to the data decision circuit 112. The amount of voltage introduced at the input of the data decision circuit 112 is equal to the target voltage level for adaptation. Depending on the outcome of the comparison (reflected in output data signal 115), the coefficients are increased or decreased.

The adaptation target circuit 126 generates an adaptation target voltage signal 127. The adaptation target voltage signal 127 represents a target voltage level for adaptation of receiver coefficients, as described above. The target voltage signal 127 may only be used during the adaptation process and may otherwise be set to zero. The target voltage signal 127 is set to a level that is used during adaptation to minimize ISI. In one embodiment, the receiver 100 includes a second summing preamp circuit (e.g., summing circuit 706 in FIG. 7) similar to the summing circuit 106 and a second decision circuit (e.g., decision circuit 712 in FIG. 7) similar to the decision circuit 112 that are used during execution of the adaptation algorithm. In this embodiment, the target signal applied to the second decision circuit can be effectively zero.

The DFE tap circuit 128 generates the DFE tap signal 129. The DFE tap circuit 128 delays the output data signal 115 by one or more clock cycles, weights the delayed data signal using a DFE tap weight, and then generates a DFE tap signal 129. The DFE tap signal 129 is thus a delayed and weighted version of the output data signal 115. The DFE tap weight (i.e. DFE tap coefficient) can be set during the adaption process by the adaption target circuit 126. Additionally, the DFE tap circuit 128 may have multiple taps with varying delays and weights that are summed together to generate the DFE tap signal 129.

Figure 4A:
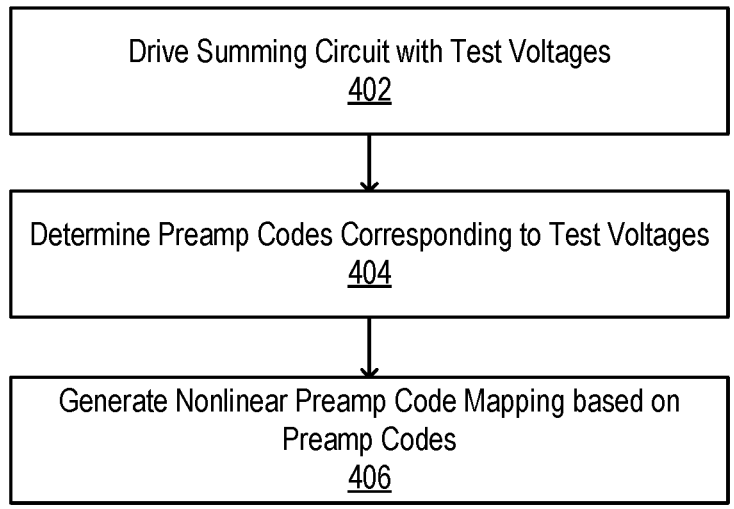
FIG. 4A is a flowchart for generating a nonlinear preamp code mapping during calibration mode, according to one embodiment.

FIG. 4A is a flowchart for generating the nonlinear preamp code mapping 134 during calibration mode, according to one embodiment. The linearization circuit 132 drives 402 the summing preamp circuit 106 with a set of equidistant test voltages at the test voltage signal 143. The set of test voltages at the test voltage signal 143 result in corrected voltages at the corrected input signal 111. The linearization circuit 132 determines 404 preamp codes corresponding to the test voltages. The linearization module generates 406 a nonlinear preamp code mapping 134 based on the preamp codes.

Figure 4B:
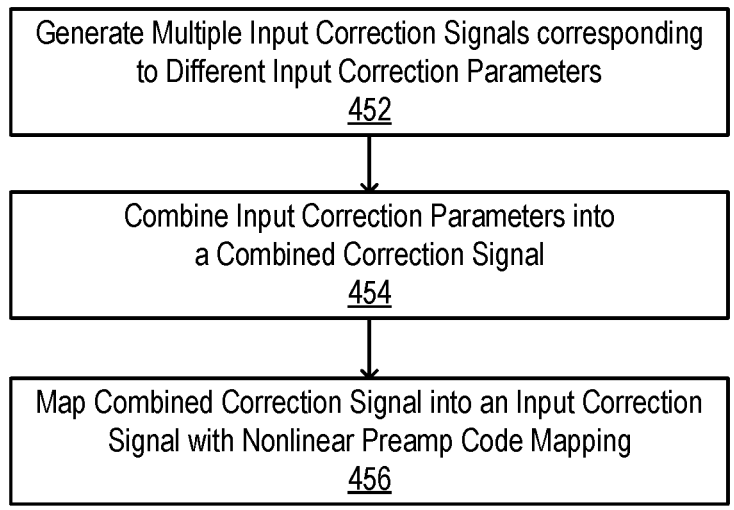
FIG. 4B is a flowchart for mapping the combined correction signal into a mapped preamp code, according to one embodiment

FIG. 4B is a flowchart for mapping the combined correction signal 131 into a mapped preamp code, according to one embodiment. The correction circuit 122 generates 452 multiple input correction signals corresponding to different input correction parameters. Specifically, the offset correction circuit 124 generates the offset correction signal 125, the adaption target circuit 126 generates the adaptation target voltage signal 127, and the DFE tap circuit 128 generates the DFE tap signal 129. The parameter summing circuit 130 of the correction circuit 122 combines 454 the input correction parameters (i.e., the offset correction signal 125, the adaptation target voltage signal 127, and the DFE tap signal 129) to generate a combined correction signal 131. The linearization circuit 132 maps 456 the combined corrected signal 131 into a preamp code of the input correction signal 141 using the nonlinear preamp code mapping 134.

Figure 5:
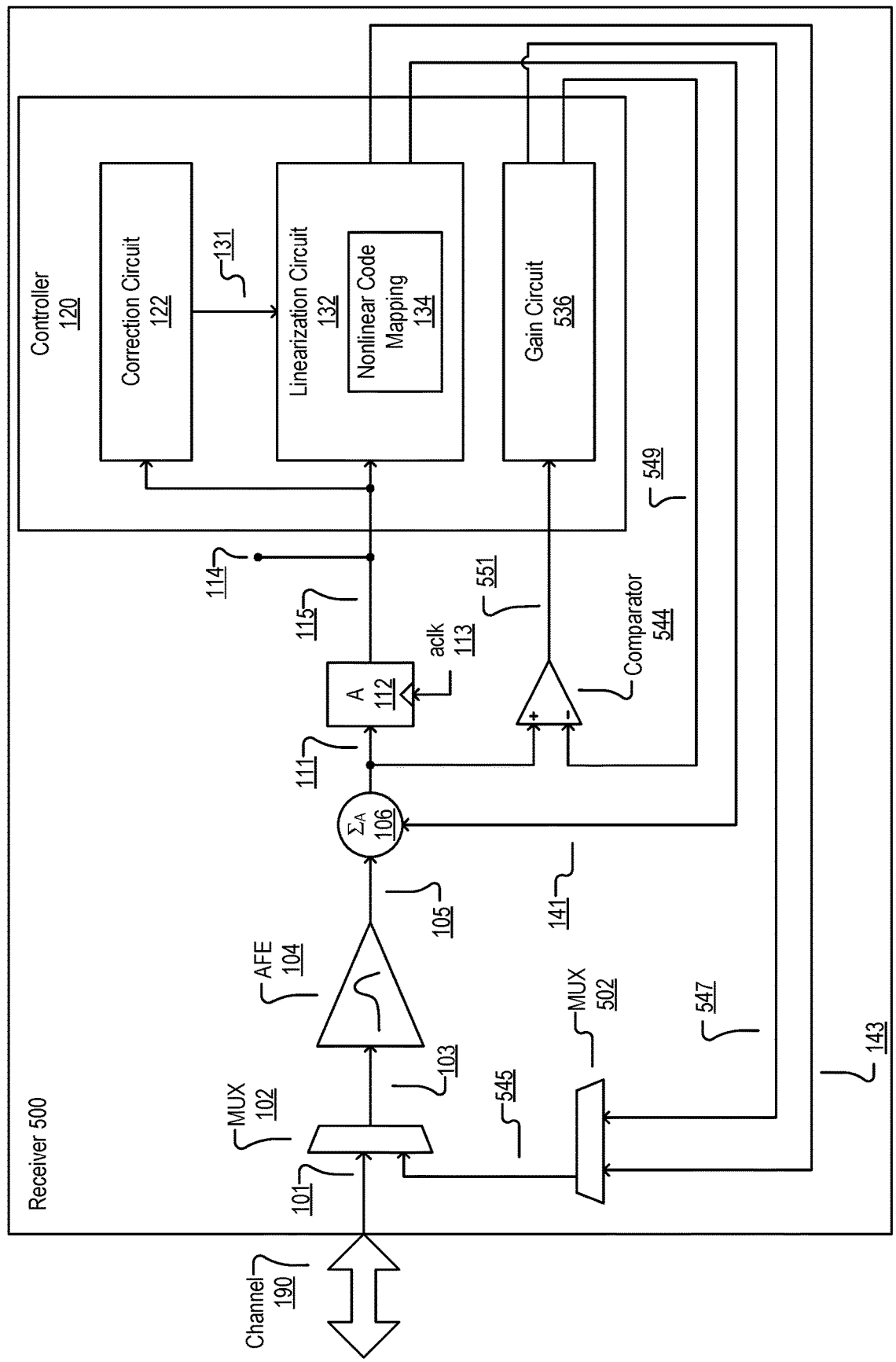
FIG. 5 is a high speed communication system that includes a receiver, according to another embodiment.

FIG. 5 is a high speed communication system that includes a receiver 500, according to another embodiment. The receiver 500 illustrated in FIG. 5 is similar to the receiver 100 illustrated in FIG. 1. The main difference is that the receiver 500 of FIG. 5 includes a MUX 502 and a comparator 544, and the controller 120 includes a gain circuit 536.

The receiver 500 of FIG. 5 can operate in three modes: the calibration mode, the normal operating mode, and a gain calculation mode. In the gain calculation mode, the gain circuit 536 calculates a gain of the AFE 104. The gain of the AFE 104 is used to determine accurate eye monitoring measurements.

The MUX 502 receives the test voltage signal 143 and a test voltage signal 547 and selects one of the test voltage signal 143 and the test voltage signal 547 for its output, selected signal 545. In the calibration mode, the MUX 502 selects the test voltage signal 143, and in the gain calculation mode, the MUX 502 selects the test voltage signal 547.

The comparator 544 receives the corrected input signal 111 (i.e., the output of the summing preamp circuit 106) and a reference voltage signal 549 and compares the received signals. The comparator 544 outputs a comparison signal 551 indicating whether the corrected input signal 111 is higher/lower than the reference voltage signal 549.

In the gain calculation mode, the gain circuit 536 receives the comparison signal 551 and outputs the test voltage signal 547 and the reference voltage signal 549. The gain circuit 536 calculates a gain of the AFE 104 and the summing preamp circuit 106 based on the reference signal 547, the test voltage signal 547 and the comparison signal 551. In one example, voltages at the test voltage signal 547 and voltages at the reference voltage signal 549 are generated from identical digital-to-analog converters of the gain circuit 536.

The gain circuit 536 outputs a first test voltage at the test voltage signal 547. The gain circuit 536 varies the voltage of the reference voltage signal 549 until the gain circuit 536 determines the comparison signal 551 changes values. The gain circuit 536 determines a first reference voltage of the reference voltage signal 549 at which the comparison signal 551 changed values. The gain circuit 536 then outputs a second test voltage at the test voltage signal 547, varies the voltage of the reference voltage 549 until the comparison signal 551 changes values, and determines a second reference voltage of the reference voltage signal 549 at which the comparison signal 551 changed values.

The gain circuit 536 calculates the gain of the AFE 104 and the summing preamp circuit 106 based on the first and second test voltages and the first and second reference voltages. The gain circuit 536 can calculate the gain of the AFE 104 and the summing preamp circuit 106 based on a quotient of a difference of the first and second reference voltages and a difference of the first and second test voltages. For example, the gain circuit 536 calculates the gain of the AFE 104 and the summing preamp circuit 106 according to equation 1:

$$K = \frac{V_{R2} - V_{R1}}{V_{T2} - V_{T1}} \quad \text{(Equation 1)}$$

where K is the gain, $V_{R2}$ is the second reference voltage, $V_{R1}$ is the first reference voltage, $V_{T2}$ is the second test voltage, and $V_{T1}$ is the first test voltage.

Figure 6:
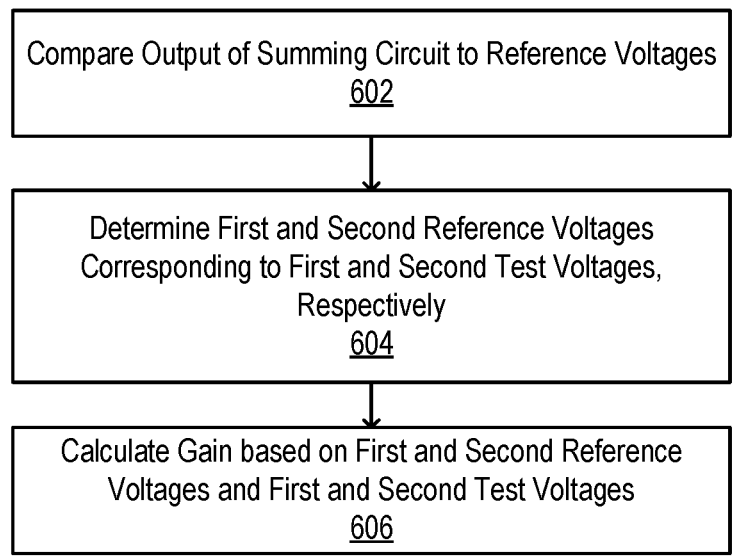
FIG. 6 is a flow chart for calculating a gain, according to one embodiment.

FIG. 6 is a flow chart for calculating a gain, according to one embodiment. The comparator 544 compares 602 the output of the summing preamp circuit 106 (i.e., the corrected input signal 111) to reference voltages at the reference voltage signal 549. The gain circuit 536 determines 604 a first reference voltage at the reference voltage signal 549 corresponding to a first test voltage at the test voltage signal 547, and a second reference voltage at the reference voltage signal 549 corresponding to a second test voltage at the test voltage signal 547. The gain circuit 536 calculates 606 the gain based on the first and second reference voltages and the first and second test voltages.

Figure 7:
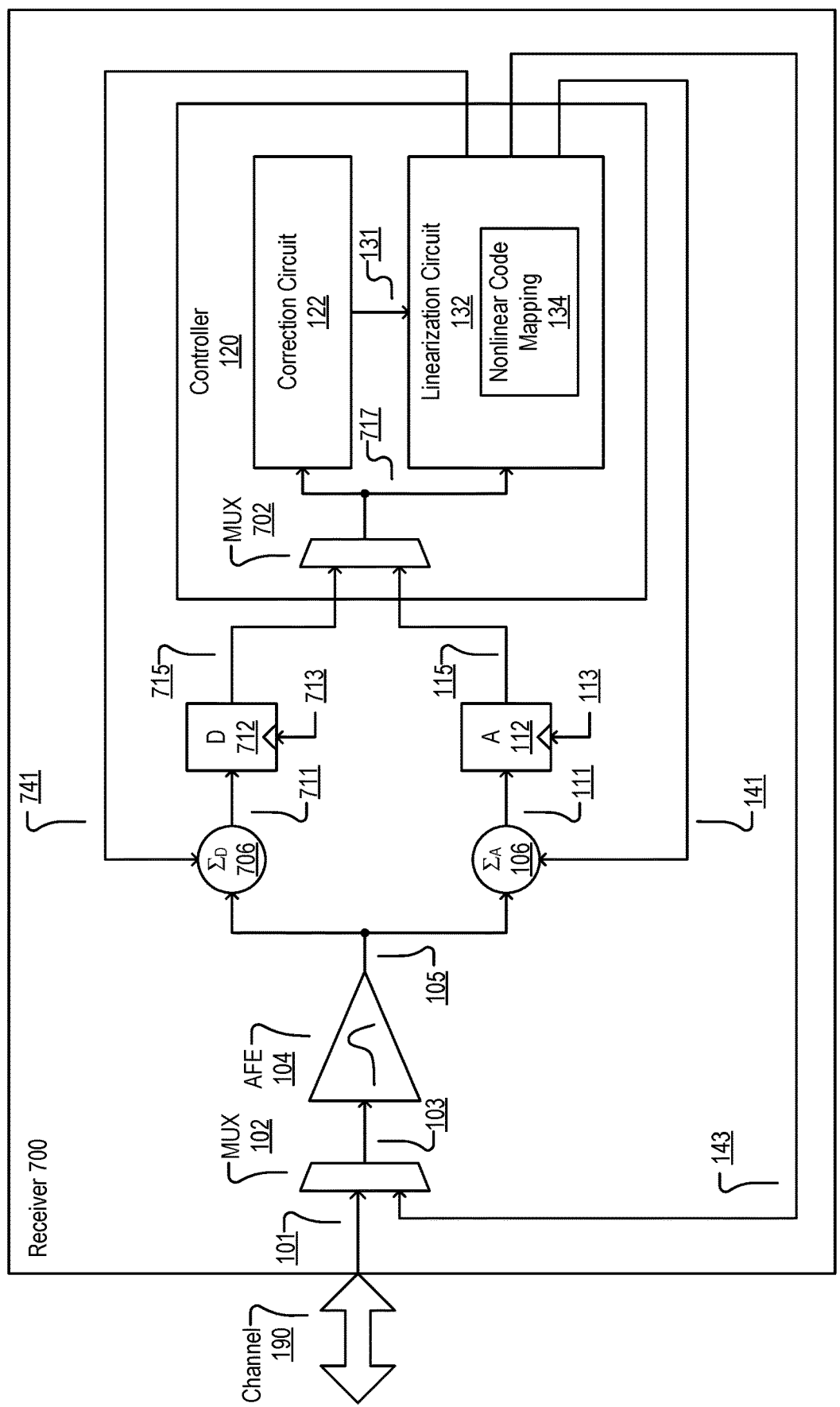
FIG. 7 is a high speed communication system that includes a receiver, according to yet another embodiment.

FIG. 7 is a high speed communication system that includes a receiver 700, according to yet another embodiment. The receiver 700 illustrated in FIG. 7 is similar to the receiver 100 illustrated in FIG. 1. The main difference is that the receiver 700 includes another summing preamp circuit 706 and another data decision circuit 712, and the controller 120 includes a MUX 702. As a result, there are two data decision paths: a main data decision path (706 and 712) and an adaptive data decision path (106 and 112).

The receiver 700 can operate in two modes: a calibration mode and a normal operating mode. In the calibration mode, the linearization circuit 132 generates different nonlinear preamp code mappings for the summing preamp circuit 706 and the summing preamp circuit 106, respectively. For example, the linearization circuit 132 generates a first nonlinear preamp code mapping correcting for nonlinear characteristics of summing preamp circuit 706, and a second nonlinear preamp code mapping correcting for nonlinear characteristics of the summing preamp circuit 106. The nonlinear preamp code mapping 134 includes the first and second nonlinear preamp code mappings.

The normal operating mode of the receiver 700 is similar to the normal operating mode of the receiver 100. The main difference is that while the main data path (706 and 712) is selected by the MUX 702, the adaptive data path (106 and 112) may be used to perform other real time calibration functions via circuitry not shown in FIG. 7, such as shifting a phase of the sampling clock 113 so that it is in the middle of a data eye. Similarly, adaptive data path may then be selected by the MUX 702 and the main data path may be used to perform other real time calibration functions such as clock phase shifting of sampling clock 713.

The summing preamp circuit 706 is the same as the summing preamp circuit 106. The summing preamp circuit 706 receives the analog input signal 105 from the AFE 104 and an input correction signal 741 from the controller 120, buffers the analog input signal 105, converts the input correction signal 741 into an analog signal, and then combines the buffered analog input signal and the converted input correction signal to generate a corrected input signal 711.

The data decision circuit 712 is the same as the data decision circuit 112. The data decision circuit 712 receives the corrected input signal 711 and makes a decision on the logical data value represented by the voltage of the corrected input signal 711. The data decision circuit 712 then generates an output data signal 715 that represents the data decision. The data decision circuit 712 is controlled by its own sampling clock 713.

The MUX 702 receives the output data signal 715 and the output data signal 115 and selects one of the output data signal 715 and the output data signal 115 for its output, selected signal 717. In the first calibration mode, the MUX 702 selects the output data signal 715, and in the second calibration mode, the MUX 702 selects the output data signal 115.

Additional Configuration Considerations

In one embodiment, a representation of circuits within a receiving device may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a transmitter having a self-triggered transition equalizer through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A receiver comprising:
    a summing preamp circuit including a first preamp converting an input correction signal and having nonlinear characteristics;
    a decision circuit having an input that is coupled to an output of the summing preamp circuit;
    circuitry to drive a set of different test voltages to an input of the summing preamp circuit;
    circuitry to determine a plurality of preamp codes for the input correction signal based on output of the decision circuit, each of the plurality of preamp codes corresponding to a corresponding one of the plurality of test voltages; and
    circuitry to generate a nonlinear preamp code mapping by selecting a subset of the plurality of preamp codes that correct the nonlinear characteristics of the first preamp.

2. The receiver of claim 1, further comprising:
    a comparator circuit to compare an input signal of the decision circuit to a reference voltage;
    circuitry to determine a first voltage level of the reference voltage corresponding to a first test voltage and a second voltage level of the reference voltage corresponding to a second test voltage based on an output of the comparator circuit; and
    circuitry to calculate a receiver gain based on the first voltage level of the reference voltage, the first test voltage, the second voltage level of the reference voltage and the second test voltage.

3. The receiver of claim 2, wherein the circuitry to calculate the gain calculates the gain based on a quotient of a difference of the first voltage level of the reference voltage and the second voltage level of the reference voltage, and the first test voltage and the second test voltage.

4. The receiver of claim 2, wherein the circuitry determines the first voltage level of the reference voltage that corresponds to the first test voltage by varying the reference voltage until a value of the comparison of the input signal of the decision circuit to the reference voltage changes.

5. The receiver of claim 4, wherein the circuitry determines the second voltage level of the reference voltage that corresponds to the second test voltage by varying the reference voltage until a value of the comparison of the input signal of the decision circuit to the reference voltage changes.

6. The receiver of claim 1, wherein the summing preamp circuit adjusts the output of the summing preamp circuit based on the input correction signal.

7. The receiver of claim 6, wherein the summing preamp circuit further includes a second preamp having substantially linear gain and a summing circuit,
    wherein the first preamp receives the input correction signal and converts the input correction signal to generate an analog correction signal,
    wherein the second preamp receives the set of test voltages and buffers the set of test voltages to generate a buffered signal, and
    wherein the summing circuit combines the analog correction signal and the buffered signal to generate a corrected input signal at the output of the summing preamp circuit.

8. The receiver of claim 1, wherein the nonlinear preamp code mapping maps a first set of preamp codes to a second set of preamp codes in a nonlinear manner.

9. The receiver of claim 1, wherein the circuitry to determine the plurality of preamp codes determines the plurality of preamp codes from preamp codes of an initial full set of preamp codes.

10. The receiver of claim 1, wherein the summing preamp circuit further includes a second preamp having linear characteristics.

11. The receiver of claim 10, wherein the summing preamp circuit further includes a summing circuit,
    wherein the first preamp receives the input correction signal and converts the input correction signal to generate an analog correction signal,
    wherein the second preamp receives an input signal of the summing preamp circuit and buffers the input signal to generate a buffered signal, and wherein the summing circuit combines the analog correction signal and the buffered signal to generate the input to the decision circuit.

12. The receiver of claim 10, wherein the first preamp comprises:
a first current source, a level of current of the first current source based on least significant bits of the input correction signal;
a first transistor and a second transistor connected to the first current source, the first transistor and the second transistor turned on based on most significant bits of the input correction signal.

13. The receiver of claim 12, wherein the first preamp comprises:
a second current source having a fixed current level;
a third transistor connected to the second current source and the first transistor, the third transistor turned on according to an input of the summing preamp circuit; and
a fourth transistor connected to the second current source and the second transistor, the fourth transistor turned on according to the input of the summing preamp circuit.

14. A method comprising:
driving a summing circuit with a set of different test voltages, a preamp of the summing circuit converting an input correction signal and having nonlinear characteristics, an output of the summing circuit coupled to an input of a decision circuit;
determining a plurality of preamp codes corresponding to the test voltages based on an output of the decision circuit, each of the plurality of preamp codes corresponding to a corresponding one of the plurality of test voltages; and
generating a nonlinear preamp code mapping for the input correction signal by selecting a subset of the plurality of preamp codes that correct for the nonlinear characteristics of the preamp.

15. The method of claim 14, further comprising:
generating an offset correction signal corresponding to a voltage offset between positive and negative inputs of the decision circuit;
generating an adaption target signal corresponding to an adaptation threshold for adaptation of one or more receiver coefficients;
generating a decision feedback equalizer (DFE) tap signal;
combining the offset correction signal, the adaptation target signal and the DFE tap signal into a preliminary input correction signal; and
mapping the preliminary input correction signal into the input correction signal using the nonlinear preamp code mapping.

16. The method of claim 14, further comprising:
comparing the output of the summing circuit to a reference voltage;
determining a first voltage level of the reference voltage corresponding to a first test voltage and a second voltage level of the reference voltage corresponding to a second test voltage; and
calculating a gain based on the first voltage level of the reference voltage, the first test voltage, the second voltage level of the reference voltage, and the second test voltage.

17. The method of claim 16, wherein calculating the gain is based on a quotient of a difference of the first reference voltage and the second reference voltage, and the first test voltage and the second test voltage.

18. The method of claim 16, wherein the first voltage level of the reference voltage that corresponds to the first test voltage is determined by varying the reference voltage until a value of the comparison of the input signal of the decision circuit to the reference voltage changes.

19. The method of claim 16, wherein the second voltage level of the reference voltage that corresponds to the second test voltage is determined by varying the reference voltage until a value of the comparison of the input signal of the decision circuit to the reference voltage changes.

20. The method of claim 16, the nonlinear preamp code mapping is stored in a look up table (LUT) or in a form of an equation.

* * * * *